United States Patent
Crema et al.

(10) Patent No.: US 11,756,899 B2
(45) Date of Patent: Sep. 12, 2023

(54) LEAD FRAME SURFACE FINISHING

(71) Applicants: STMICROELECTRONICS S.R.L., Agrate Brianza (IT); STMICROELECTRONICS INTERNATIONAL N.V., Schiphol (NL)

(72) Inventors: Paolo Crema, Vimercate (IT); Jürgen Barthelmes, Berlin (DE); Din-Ghee Neoh, Singapore (SG)

(73) Assignees: STMICROELECTRONICS S.R.L., Agrate Brianza (IT); STMICROELECTRONICS INTERNATIONAL N.V., Schiphol (NL)

( * ) Notice: Subject to any disclaimer, the term of this patent is extended or adjusted under 35 U.S.C. 154(b) by 281 days.

(21) Appl. No.: 17/322,712

(22) Filed: May 17, 2021

(65) Prior Publication Data
US 2021/0375787 A1    Dec. 2, 2021

Related U.S. Application Data

(62) Division of application No. 16/299,085, filed on Mar. 11, 2019, now Pat. No. 11,011,476.
(Continued)

(51) Int. Cl.
*H01L 23/00* (2006.01)
*C25D 3/38* (2006.01)
(Continued)

(52) U.S. Cl.
CPC .............. *H01L 23/562* (2013.01); *C25D 3/38* (2013.01); *C25D 5/10* (2013.01); *C25D 5/48* (2013.01);
(Continued)

(58) Field of Classification Search
CPC .............. H01L 23/562; H01L 23/3114; H01L 23/49513; H01L 23/4952; H01L 23/49541;
(Continued)

(56) References Cited

U.S. PATENT DOCUMENTS 4,800,178 A    1/1989  Mathew et al.
5,329,158 A    7/1994  Lin
(Continued)

FOREIGN PATENT DOCUMENTS

CN    1047939 A    12/1990
CN    1148732 A    4/1997
(Continued)

OTHER PUBLICATIONS

JEDEC, "Test Method for Measuring Whisker Growth on Tin and Tin Alloy Surface Finishes," JEDEC Standard, JESD22-A121A, Jul. 2008, (Revision of JESD22-A121.01, Dec. 2005) 32 pages.
(Continued)

*Primary Examiner* — Alonzo Chambliss
(74) *Attorney, Agent, or Firm* — Seed IP Law Group LLP

(57) ABSTRACT

The present disclosure is directed to a lead frame design that includes a copper alloy base material coated with an electroplated copper layer, a precious metal, and an adhesion promotion compound. The layers compensate for scratches or surface irregularities in the base material while promoting adhesion from the lead frame to the conductive connectors, and to the encapsulant by coupling them to different layers of a multilayer coating on the lead frame. The first layer of the multilayer coating is a soft electroplated copper to smooth the surface of the base material. The second layer of the multilayer coating is a thin precious metal to facilitate a mechanical coupling between leads of the lead frame and conductive connectors. The third layer of the multilayer
(Continued)

coating is the adhesion promotion compound for facilitating a mechanical coupling to an encapsulant around the lead frame.

20 Claims, 6 Drawing Sheets

Related U.S. Application Data

(60) Provisional application No. 62/641,923, filed on Mar. 12, 2018.

(51) Int. Cl.
```
C25D 5/10      (2006.01)
C25D 5/48      (2006.01)
H01L 21/48     (2006.01)
H01L 23/31     (2006.01)
H01L 23/495    (2006.01)
C25D 5/00      (2006.01)
C25D 7/00      (2006.01)
```
(52) U.S. Cl.
CPC .............. *C25D 5/605* (2020.08); *C25D 5/611* (2020.08); *C25D 7/00* (2013.01); *H01L 21/4825* (2013.01); *H01L 23/3114* (2013.01); *H01L 23/4952* (2013.01); *H01L 23/49513* (2013.01); *H01L 23/49541* (2013.01); *H01L 23/49582* (2013.01)

(58) Field of Classification Search
CPC .......... H01L 21/4825; H01L 23/49582; C25D 5/611; C25D 5/605; C25D 3/38; C25D 5/10; C25D 5/48; C25D 7/00
See application file for complete search history.

(56) References Cited

U.S. PATENT DOCUMENTS

| | | | |
|---|---|---|---|
| 5,728,285 A | | 3/1998 | Mathew |
| 5,994,767 A | * | 11/1999 | Huang .................... H01L 24/32 257/676 |
| 6,034,422 A | * | 3/2000 | Horita .................... H01L 24/85 257/677 |
| 6,037,653 A | | 3/2000 | Kim et al. |
| 6,040,633 A | | 3/2000 | Manteghi |
| 6,150,711 A | | 11/2000 | Kom et al. |
| 6,245,448 B1 | * | 6/2001 | Abbott .................... H01L 24/48 427/125 |
| 6,646,330 B2 | | 11/2003 | Kubara et al. |
| 7,148,085 B2 | * | 12/2006 | Abbott ................ H05K 3/3426 438/612 |
| 7,190,057 B2 | | 3/2007 | Seki et al. |
| 7,368,326 B2 | | 5/2008 | Osenbach et al. |
| 7,391,116 B2 | | 6/2008 | Chen et al. |
| 7,788,800 B2 | * | 9/2010 | Abbott .................... H01L 24/97 427/125 |
| 9,059,185 B2 | | 6/2015 | Abbott |
| 9,653,385 B1 | | 5/2017 | Fang |
| 9,679,832 B1 | | 6/2017 | Heng |
| 10,665,533 B2 | | 5/2020 | Sonehara et al. |
| 11,011,476 B2 | * | 5/2021 | Crema ................ H01L 23/3114 |
| 2002/0047186 A1 | | 4/2002 | Tellkamp |
| 2002/0187364 A1 | | 12/2002 | Heber et al. |
| 2003/0201532 A1 | | 10/2003 | Riedl |
| 2006/0145311 A1 | * | 7/2006 | Abbott .............. H01L 23/49582 257/E23.054 |
| 2007/0015001 A1 | | 1/2007 | Uno et al. |
| 2009/0108420 A1 | | 4/2009 | Okura et al. |
| 2010/0015577 A1 | | 1/2010 | Cinader, Jr. et al. |
| 2010/0155770 A1 | | 6/2010 | Tomohiro et al. |
| 2010/0195292 A1 | | 8/2010 | Ide et al. |
| 2011/0079887 A1 | | 4/2011 | Shim et al. |
| 2012/0205790 A1 | | 8/2012 | Haga |
| 2012/0299172 A1 | | 11/2012 | Kim et al. |
| 2020/0211953 A1 | | 7/2020 | Di Dio |

FOREIGN PATENT DOCUMENTS

| | | |
|---|---|---|
| CN | 1949494 A | 4/2007 |
| CN | 101162712 A | 4/2008 |
| CN | 101314832 A | 12/2008 |
| CN | 102738109 A | 10/2012 |
| CN | 103928302 A | 7/2014 |
| CN | 104851866 A | 8/2015 |
| CN | 107154392 A | 9/2017 |
| EP | 0 538 019 A2 | 4/1993 |
| JP | 57-122554 A | 7/1982 |
| JP | 57-184244 A | 11/1982 |
| JP | 59-231844 A | 12/1984 |
| JP | 60-24045 A | 2/1985 |
| JP | 61-136699 A | 6/1986 |
| JP | 61-139050 A | 6/1986 |
| JP | 61-150284 A | 7/1986 |
| JP | 4-137552 A | 5/1992 |
| JP | 6-142161 A | 5/1994 |
| JP | 6-214452 A | 8/1994 |
| JP | 6-334087 A | 12/1994 |
| JP | 7-231060 A | 8/1995 |
| JP | 8-296050 A | 11/1996 |
| JP | 9-116064 A | 5/1997 |
| JP | 11-350188 A | 12/1999 |
| JP | 2003-155395 A | 5/2003 |
| JP | 2004-82103 A | 3/2004 |
| JP | 2004-282103 A | 10/2004 |
| JP | 2014-84476 A | 5/2014 |
| JP | 2014-192310 A | 10/2014 |
| JP | 2014-222751 A | 11/2014 |
| JP | 2015-103615 A | 6/2015 |
| KR | 10-2010-0039678 A | 4/2010 |
| WO | 95/18464 A1 | 7/1995 |
| WO | 2010/043291 A1 | 4/2010 |
| WO | 2010/104274 A2 | 9/2010 |
| WO | 2017/153590 A1 | 9/2017 |

OTHER PUBLICATIONS

JEDEC, "Environmental Acceptance Requirements for Tin Whisker Susceptibility of Tin and Tin Alloy Surface Finishes," JEDEC Standard, JESD201, Mar. 2006, 28 pages.

Oberndorff et al., "Whisker Formation on Sn Plating," Proceedings of IPC/JEDEC Fifth International Conference on Lead-Free Electronic Components and Assemblies, 2004.

\* cited by examiner

LEAD FRAME SURFACE FINISHING

BACKGROUND

Technical Field

The present disclosure is directed to an improved lead frame, and in particular, to a lead frame coating that smooths surface defects for lead frame wire bonding.

Description of the Related Art

Semiconductor packages can include a semiconductor die and a lead frame that provides an interface between external contacts through the lead frame to the semiconductor die. The semiconductor package has an encapsulant around the various elements in the semiconductor package to secure everything into a single discrete unit. The semiconductor die is typically placed on the lead frame, and the combination is covered with encapsulant in an application chamber, with the encapsulant typically being applied at high pressure or temperature, and then being allowed to cool and solidify around the package elements.

The lead frame of a semiconductor package provides a more easily integrated hardware interface to the semiconductor die with minimal electrical signal degradation. In addition, the encapsulant of the semiconductor package provides an environmental barrier to protect the semiconductor die, as well as structural support to the leads extending from the semiconductor die. Not all types of lead frames provide a sufficient hardware interface to the semiconductor die with minimal electrical signal degradation while also maintaining the environmental protection and structural support properties desired for the semiconductor package. Specifically, one type of lead frame has a copper lead frame spot coated with at least 3 micrometers ($\mu m$) of silver, as wires bond weakly to bare copper. The silver lead frame coating smooths the surface of the lead frame to improve wire bonding to the leads of the lead frame with wires. However, 3 $\mu m$ lead frame coatings of silver suffer from high cost and weak mechanical bonding with the encapsulant. In addition, spot coating is a time consuming process. Thus, what is needed is a device that encourages a higher quality of electrical connection with minimal sacrifice of environmental protection and structural support.

BRIEF SUMMARY

The present disclosure is directed to a semiconductor package with a lead frame that includes a copper alloy base material surrounded by a multilayer coating and a method of making the same. The multilayer coating includes a first coating of copper (e.g., electroplated copper), a second coating of precious metal, and a third coating of an adhesion promotion compound. The semiconductor package is formed by attaching wires to leads of the lead frame and at least partially encapsulating the lead frame with an encapsulant. In some embodiments, the semiconductor package includes a semiconductor die or chip attached to the second coating of the lead frame.

In some embodiments, the lead frame is formed from pressing a sheet of base material with rollers. The rolled lead frame base material includes scratches that are smoothed by the application of the first coating. The first coating provides a smooth surface onto which the second coating is applied. To facilitate the smoothing, the lead frame base material has a typical hardness between 100-200 HV, which is greater than the hardness of the first coating which has a typical hardness between 100-120 HV. The scratches are often less than 0.05 $\mu m$ in depth. The wires are bonded to the second coating, with the third coating covering the exposed areas of the second coating. The third coating is an adhesion promoter to increase the strength of a mechanical coupling of the encapsulant to the lead frame. In some embodiments, the third coating is formed by a reaction between an exposed surface of the second coating and a reactive species, and the encapsulant is a resin.

In some embodiments, the first coating is copper (e.g., pure copper), the second coating is silver, and the third coating is silver oxide. The first coating is greater than 0.1 $\mu m$ in thickness, and in some embodiments is between 0.2 $\mu m$ and 2.0 $\mu m$. The second coating is less than 0.1 $\mu m$ in thickness, and in some embodiments is between 0.01 $\mu m$ and 0.3 $\mu m$. Furthermore, the wires include one of copper, gold, silver, and aluminum.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Throughout the specification, the term "layer" is used in its broadest sense to include a thin film, a cap, or the like, and one layer may be composed of multiple sub-layers.

Specific embodiments of semiconductor packages are described herein; however, the present disclosure and the reference to certain materials, dimensions, and the details and ordering of processing steps are exemplary and should not be limited to those shown.

Figure 1:
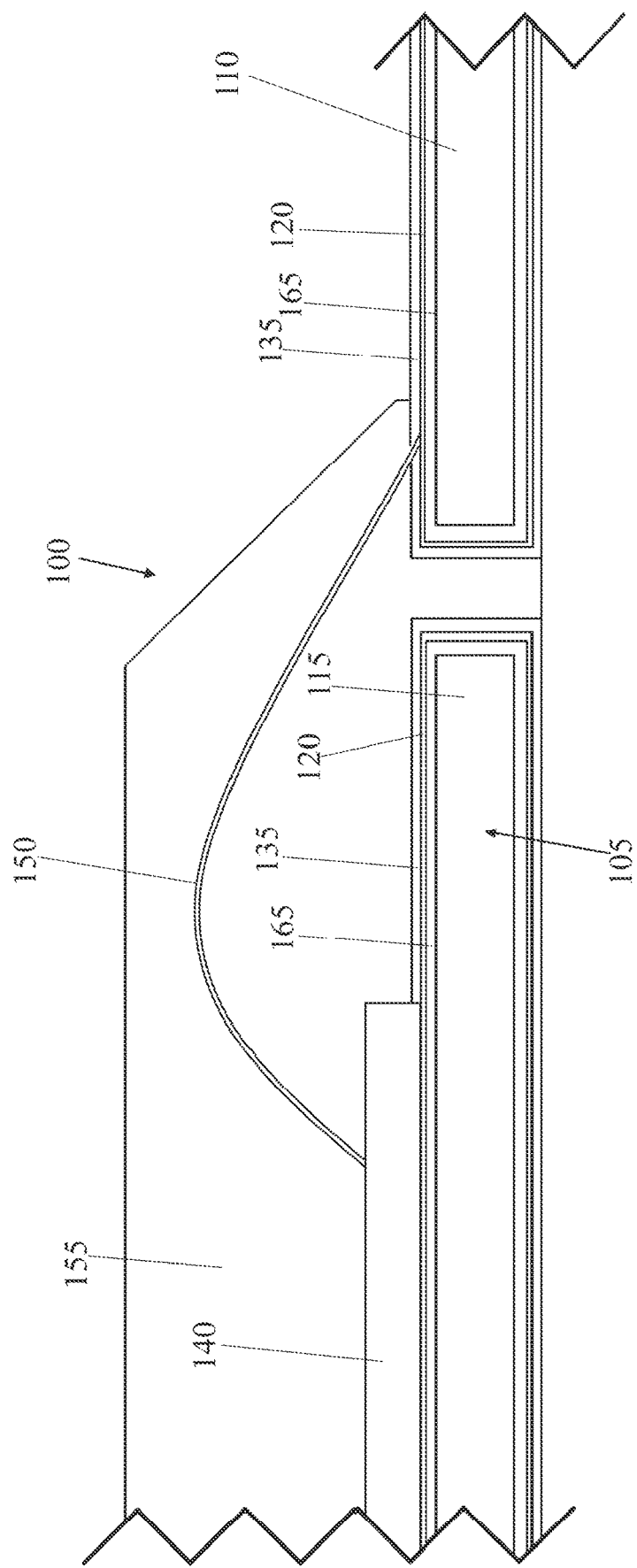
FIG. 1 is a cross-sectional view of an exemplary semiconductor package.

FIG. 1 is an exemplary embodiment of the present disclosure showing a cross-sectional view of a package 100 comprising a lead frame 105 during processing. In embodiments, the lead frame 105 includes a plurality of leads 110 spaced from a die pad 115. A die 140 is coupled to the die pad 115 of the lead frame 105. Wires 150 couple the die to the leads 110.

The die pad 115 and the leads 110 are covered by several layers, which include a first coating 165 that is adjacent to the lead frame. There is a second coating 120 on the first coating 165, and a third coating 135 on the second coating 120. Encapsulant (e.g., molding compound) 155 is formed around the die 140, the lead frame 105, and parts of the leads 110. The encapsulant 155 may be formed to fully encapsulate the die pad 155. Alternatively, the die pad and back surface of the lead frame 105 may be exposed.

The die pad 115 may have a rectangular shape. However, one of skill in the art will appreciate that the die pad 115 and the lead frame 105 can be formed to have alternate shapes, for example a circle or a rectangle.

In some embodiments the plurality of leads 110 includes an even number of leads 110 spaced equidistant from each other, with an identical number of leads 110 on each edge of the lead frame 105. However, other embodiments may include fewer, or more leads 110 with different spacing and arrangement in order to suit particular package requirements.

In various embodiments, the lead frame 105 is made of copper or a copper alloy, although other known metals, other conductive materials, or nonconductive materials may be used.

A first coating 165 is a conductive material and is formed on a surface of the lead frame 105. In embodiments, the first coating 165 is a copper or copper alloy. The first coating 165 may be formed using any suitable method. For example, the first coating 165 may be deposited by electrolytic deposition, chemical-vapor deposition (CVD), sputtering, electroless plating, spray-coating, etc. In certain embodiments, the first coating 165 is deposited by electrolytic deposition on the surface of the lead frame 105. In some embodiments, the first coating 165 is selectively deposited (e.g., using a mechanical mask or some other masking technique) so as to extend selectively only over certain areas. In embodiments, the first coating 165 has a thickness of at least about 1 μm. In some embodiments, the first coating 165 has a thickness ranging from about 1 μm to about 2 μm.

In some embodiments, the lead frame is treated before the first coating 165 is applied. Such treatments may include electrocleaning, which may be used to remove oxides, impurities, organic materials, and the like from the surface of the lead frame. Other treatment steps that may be used include activation treatments. In some embodiments, activation treatments include use of an acidic etchant solution (e.g., Descabase (Atotech Deutschland GmbH), a sulfuric acid solution, etc.). An activation treatment may be used to remove oxides and to activate the lead frame 105 in order to improve the adhesiveness and uniformity of the first coating 165. A rinsing step may be employed before the treatment step(s), between the treatment step(s), after the treatment step(s) and before the first coating 165 is applied, after the first coating 165 is applied, or any combination thereof.

The second coating 120 is formed on at least a portion of a surface of the first coating 165. As shown in FIG. 1, the second coating 120 is formed on all surfaces of the lead frame 105. In various embodiments, the second coating 120 may be formed on a first surface of the lead frame 105. In some embodiments, the second coating 120 is formed on a second surface. In other embodiments, the second coating 120 is formed on surfaces of one or more of the plurality of leads 110.

In various embodiments, the second coating 120 comprises at least one transition metal. In some embodiments, the second coating 120 comprises a precious metal. In further embodiments, the second coating 120 comprises a group 10 or group 11 metal. In some embodiments, the second coating 120 comprises a group 10 metal. In other embodiments, the second coating 120 comprises a group 11 metal. In certain embodiments, the second coating 120 comprises nickel, gold, silver, or a combination thereof. In particular embodiments, the second coating 120 comprises silver. In embodiments, the second coating 120 has a thickness of at least about 0.1 μm. In some embodiments, the second coating 120 has a thickness ranging from about 0.1 μm to about 0.3 μm.

A die 140 is coupled to the surface of the second coating 120. In embodiments, the die 140 may be coupled to the die pad 115 with the glue or tape 145. Then, the plurality of wires 150 are bonded between pillars or bumps on the die 140 and contact pads on the plurality of leads 110. The coupling between the wires 150 and the die 140 may be accomplished via one or more electrical contacts, which may be contact pads, pillars or solder bumps extending from the die 140 and one or more contact pads or lands on the leads 110.

A third coating 135 is formed on the second coating 120. The third coating 135 is an adhesion promotion compound (e.g., a metal oxide layer). Accordingly, embodiments of the present disclosure include a device comprising a copper lead frame, a first coating on at least a portion of the copper lead frame, a second coating on the first coating, and a third coating on the second coating. In some embodiments, the first coating 165, the second coating 120 and the third coating 135 are formed at least on the leads 110 of the lead frame 105.

The third coating 135 may comprise the same metal(s) as the second coating 120, for example, if the third coating 135 is a metal oxide layer. Thus, the third coating 135 may comprise at least one transition metal. In some embodiments, the third coating 135 comprises a precious metal. In some embodiments, the third coating 135 comprises a group 10 or group 11 metal. In certain embodiments, the third coating 135 comprises nickel oxide, gold oxide, silver oxide, or a combination thereof. In particular embodiments, the third coating 135 comprises silver oxide. In specific embodiments, the second coating 120 is a layer of silver and the third coating 135 is silver oxide.

In embodiments, the third coating 135 has a thickness of at least about 1 nanometer (nm). In some embodiments, the third coating 135 has a thickness ranging from about 1 nm to about 3 nm.

The encapsulant 155 is deposited over the plurality of wires 150, the lead frame 105, the leads 110, the die pad 115, and the third coating 135 to form the package 100. In the package 100, the encapsulant 155 may completely surround the third coating 135. Alternatively, the encapsulant 155 may partially surround the third coating 135, as shown in FIG. 1. In some embodiments, the encapsulant 155 is formed on the plurality of wires 150, the lead frame 105, the leads 110, the die pad 115, and a surface of the third coating 135.

Figure 2A:
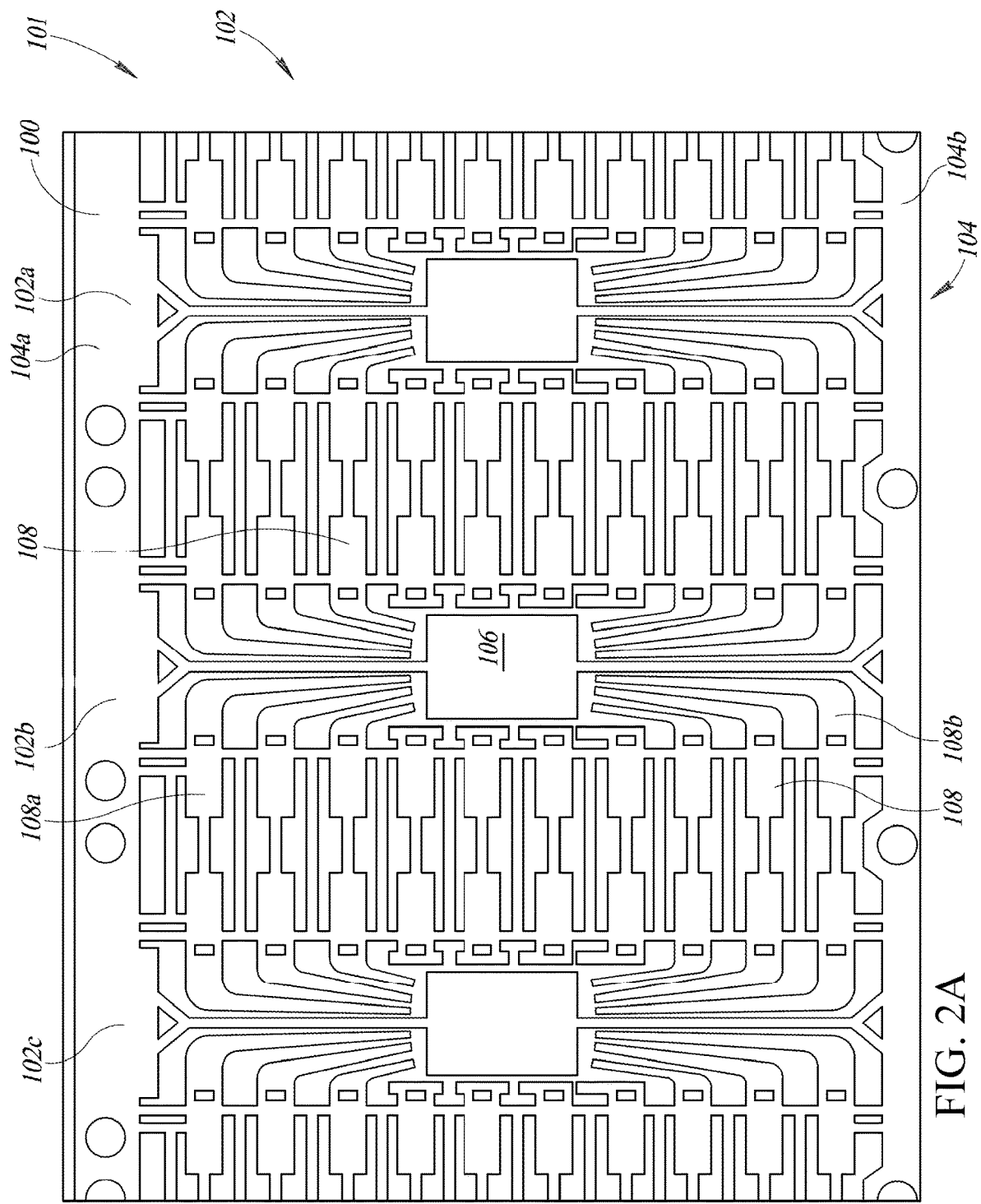
FIG. 2A is a plan view of an exemplary lead frame reel.

FIG. 2A is a plan view of an exemplary lead frame reel. In the manufacturing process of a lead frame, a plurality of lead frames may be formed by taking a reel of copper alloy material and rolling the pattern of the lead frames into the reel of copper alloy material.

The present disclosure is generally directed to the manufacturing of lead frames, such as the exemplary lead frames shown in FIG. 2A. A base material (or substrate) 100, such as copper or a copper alloy, is formed into a lead frame reel 101. The copper alloy may be doped with any number of materials, and in one embodiment is doped with a material to increase the hardness of the base material 100. Examples of some copper alloys include Cartridge Brass (Cu 70 wt. %, Zn 30 wt. %), Aluminum Bronze (Cu 92 wt. %, Al 8 wt. %), Beryllium Copper (Cu 98 wt. %, Be 2 wt. %), Nickel Silver (Cu 78 wt. %, Ni 12 wt. %, Pb 10 wt. %), Cupronickel (Cu 70 wt. %, Ni 30 wt. %), and Gunmetal (Cu 90 wt. %, Sn 10 wt. %). Other copper alloys used as the base material include unified numbering system C19400, C70250, and C19210. Other base materials 100 may be used, such as aluminum based lead frames. The formation of the lead frame reel 101 may be by stamping, cutting, pressing, rolling, printing, or any other lead frame formation method known in the art. After formation of the lead frame reel, the base material 100 is shaped into a plurality of lead frames 102 including lead frames 102a, 102b, 102c. During the manufacturing process, the lead frames 102a, 102b, 102c will be singulated from one another. Singulation may occur during the initial formation of the lead frames 102 or, as is depicted in FIG. 2A, may occur at some point in time after formation of the lead frames 102.

The lead frame reel 101 is copper or a copper alloy in some embodiments, which may include any number of additional elements in any quantity. In some embodiments, additional elements are combined with copper to increase the hardness of the lead frame reel 101 to a hardness greater than a hardness of pure copper. Exemplary hardness's that may be achieved include hardness's between 100 HV (Vickers Pyramid Number) to 200 HV, with some embodiments including a hardness of 180 HV to 200 HV. In other embodiments, the lead frame reel 101 is formed of a different material, such as a metal, plastic, semiconductor, alloy, composite, or other material with varying levels of hardness.

Lead frames 102a, 102b, 102c of the lead frames 102 are joined together by reel feed guides 104. In the depicted embodiment, a first reel feed guide 104a is on a first side of the lead frames 102 and a second reel feed guide 104b is on a second side of the lead frames 102. In this configuration, the reel feed guides 104 assist the manufacturing machinery in physically guiding the lead frames 102 along the assembly line to receive the downstream manufacturing steps.

Each of the lead frames 102 includes a die pad (or main body) 106 and a plurality of leads 108, including a first lead 108a and a second lead 108b. With respect to the lead frame 102b, the die pad 106 is positioned near a central portion of the lead frame 102b with the leads 108 radiating outward towards sides of the lead frame 102b. Two or more of the leads 108 may be joined together during the formation of the lead frame reel 101. Any of these leads may be electrically isolated from the other leads of the leads 108 during later steps of the manufacturing process. The leads 108 are formed from the same base material 100 as the die pad 106. In other embodiments, the leads 108 are formed from a different material than the die pad 106. The leads 108 provide a landing for bonding wires to couple the leads 108 to various inputs of a semiconductor die positioned on the die pad 106 of the lead frame 102b.

Figure 2B:
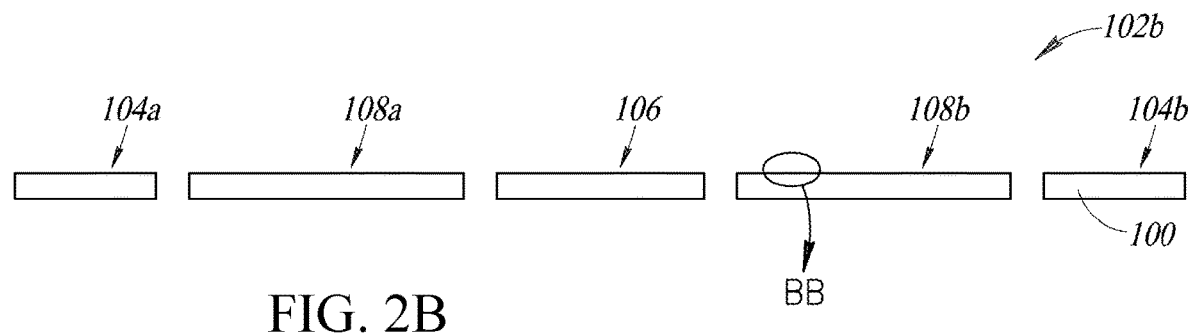
FIG. 2B is a cross-sectional view of the lead frame reel.

FIG. 2B depicts the lead frame 102b after an initial forming step to form the various components of the lead frame 102b, in one embodiment. In other embodiments, FIG. 2B depicts the lead frame 102b at an intermediate or terminal step of the manufacturing process in which the various components of the lead frame 102b are formed after other manufacturing steps. The cross-sectional view includes the first reel feed guide 104a, the first lead 108a, the die pad 106, the second lead 108b, and the second reel feed guide 104b.

FIG. 2B includes a highlighted view area BB that indicates an area for magnification from the cross-sectional view of FIG. 2B. The highlighted view area BB includes a surface of the lead frame 102b at the second lead 108b. FIGS. 3A-3D depict a cross-sectional view of the highlighted view area BB shown in FIG. 2B, with each figure depicting various manufacturing steps of the lead frame 102b. Although FIGS. 3A-3D depict layers of the second lead 108b, the same layers and base material are used for some or all of the leads 108, the die pad 106, and the reel feed guides 104.

Figure 3A:
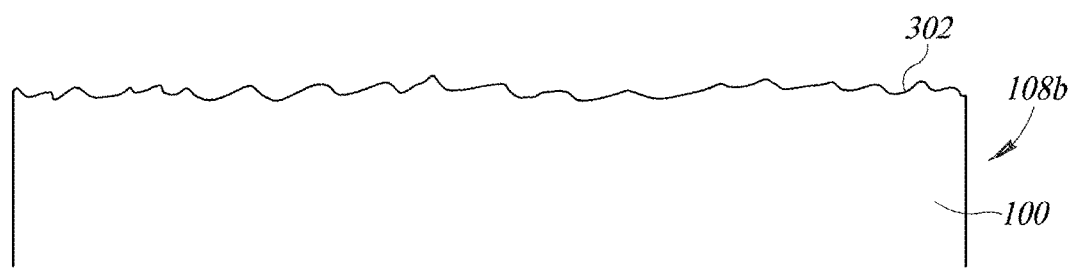
FIGS. 3A-3D are cross-sectional views of the lead frame taken at the magnified view area BB shown in FIG. 2B, showing the various steps of manufacturing the lead frame.

FIGS. 3A-3D are cross-sectional views of the lead frame 102b taken at the highlighted view area BB shown in FIG. 2B, showing the various steps of manufacturing the lead frame. Specifically, FIG. 3A depicts the second lead 108b of the lead frame 102b. As discussed previously, the base material 100 of the lead frame 102b may be formed from any one of many different manufacturing methods. During formation, a surface 302 of the base material 100 of the lead frame 102b may be scratched or otherwise formed with surface irregularities. For example, a rolling press of the lead frame reel 101 may cause the surface 302 to be formed with a plurality of surface scratches that can prevent successful wire bonding to the surface 302. In some embodiments, the surface scratches may be formed along a first direction of the surface 302 and not along a second direction perpendicular to the first direction. In other embodiments, the surface scratches or surface irregularities are in any direction on the surface 302. Additionally, the scratches on the surface 302 may be only on a first side of the lead frame 102b, a plurality of sides of the lead frame 102b, or on all sides of the lead frame 102b, including interior surfaces. The scratches or surface irregularities can be to any depth, and in some embodiments have an average depth or a max depth of less than 0.05 μm.

Figure 3B:
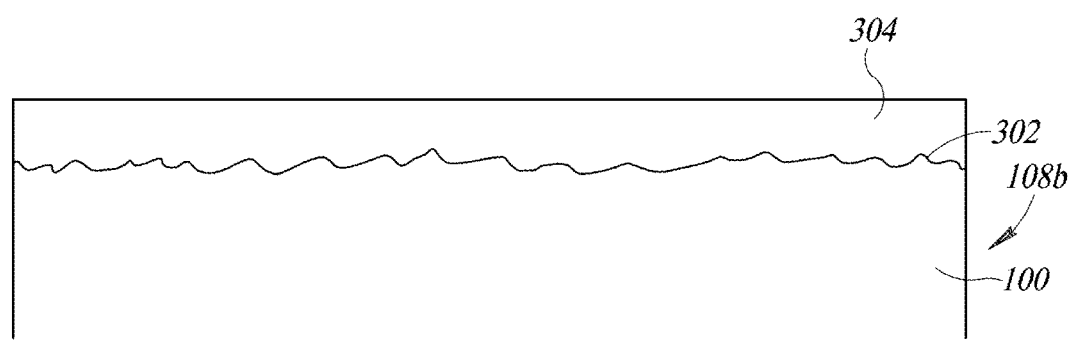

FIG. 3B depicts the second lead 108b coated with a first coating 304. The first coating 304 may coat only a first side of the lead frame 102b, a plurality of sides of the lead frame 102b, or all sides of the lead frame 102b, including interior surfaces. Fully coating all sides of the lead frame 102b allows for the coating application to be completed without the use of a mask, decreasing cost, time, and complexity of the coating application. In some embodiments, the first coating 304 is a copper material. In particular embodiments, the first coating 304 is pure copper. In other embodiments the first coating 304 is any one of the materials in the lead frame reel 101. In yet other embodiments, the first coating 304 is any material used during the manufacturing process of the lead frame reel 101. The first coating 304 may be applied to the surface 302 using any known application technique, including chemical vapor deposition (CVD), physical vapor deposition (PVD), spin coating, and in one embodiment, is applied by electroplating the first coating 304 to the surface 302 of the lead frame 102*b*.

In some embodiments, the first coating 304 has a thickness greater than the depth of the scratches or surface irregularities of the surface 302. In these embodiments, the first coating 304 has an irregular first side on the scratches or surface irregularities, and a planar second side opposite the first side. The planar second side thus smooths the surface of the scratches or surface irregularities of the surface 302. In other embodiments, the thickness of the first coating 304 is independent of the depth of the scratches or surface irregularities in the surface 302. In some embodiments, the first coating 304 has a thickness of at least 0.1 µm, and, in some embodiments, the average or maximum thickness of the first coating 304 is between 0.2 µm and 2.0 µm. In other embodiments, the average or maximum thickness of the first coating 304 is greater than 2.0 µm.

The first coating 304 can have any level of hardness. In some embodiments, the first coating 304 has a hardness that is less than the hardness of the lead frame reel 101, such as a hardness of 100-120 HV. A soft pure copper is used in one embodiment to increase the reliability of wire bonding to the lead frame 102*b*.

Figure 3C:
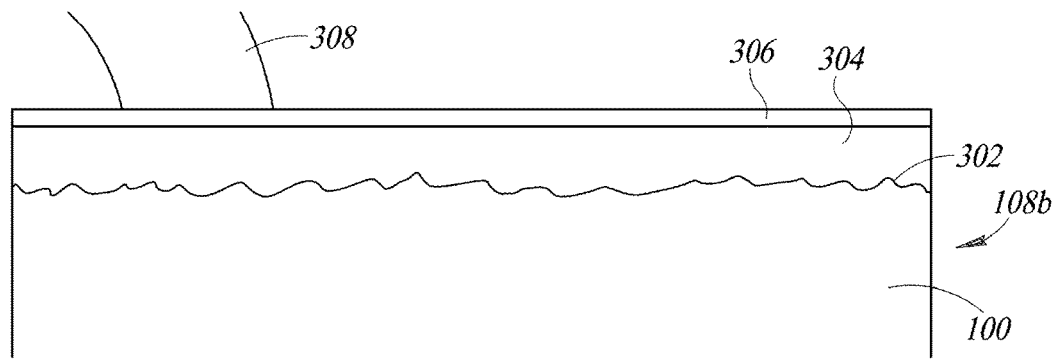

FIG. 3C depicts the second lead 108*b* coated with a second coating 306 and a conductive connector 308 coupled to the second coating 306. The second coating 306 may coat only a first side of the lead frame 102*b*, a plurality of sides of the lead frame 102*b*, or all sides of the lead frame 102*b*, including interior surfaces. Fully coating all sides of the lead frame 102*b* allows for the coating application to be completed without the use of a mask, decreasing cost, time, and complexity of the coating application. In some embodiments, the second coating 306 is silver. In other embodiments the second coating 306 is any precious metal. In yet other embodiments, the second coating 306 is any material used during the manufacturing process of a semiconductor package. The second coating 306 may be applied to the first coating 304 using any known application technique, including CVD, PVD, spin coating, and electroplating.

In some embodiments, the second coating 306 has a thickness less than the first coating 304. For example, the thickness of the second coating 306 can be less than 0.1 µm, and, in some embodiments, the average or maximum thickness of the second coating 306 is between 0.01 µm and 0.1 µm.

FIG. 3C also includes the conductive connector 308 coupled to a portion of the second coating 306. The conductive connector 308 is any connector used to couple the lead frame 102*b* to a semiconductor die on the lead frame 102*b*. In some embodiments, the conductive connector 308 is a bonding wire. The conductive connector is a metal in some embodiments, such as copper, gold, silver, and aluminum. As depicted in FIG. 3C, the thin conductive connector 308 is coupled to the second coating 306 to improve the mechanical bond strength between the conductive connector 308 and the lead frame 102*b*. The improved mechanical bonding can be achieved through superior chemical properties of the second coating 306 as it relates to the conductive connector 308, and the softness and level surface of the underlying first coating 304. For example, the application of the second coating 306 may help prevent oxidation of the first coating. As oxidation of the materials used in the first coating 304 (e.g., electroplated pure copper) can be detrimental to the bonding strength of the conductive connector 308 to the lead frame 102*b*, the application of the thin second coating 306 to prevent oxidation of the first coating 304 can increase the strength of the mechanical bond to the conductive connector 308. Improved mechanical bonding can refer to an increased pull strength, an increased sheer stress resistance, or both.

Figure 3D:
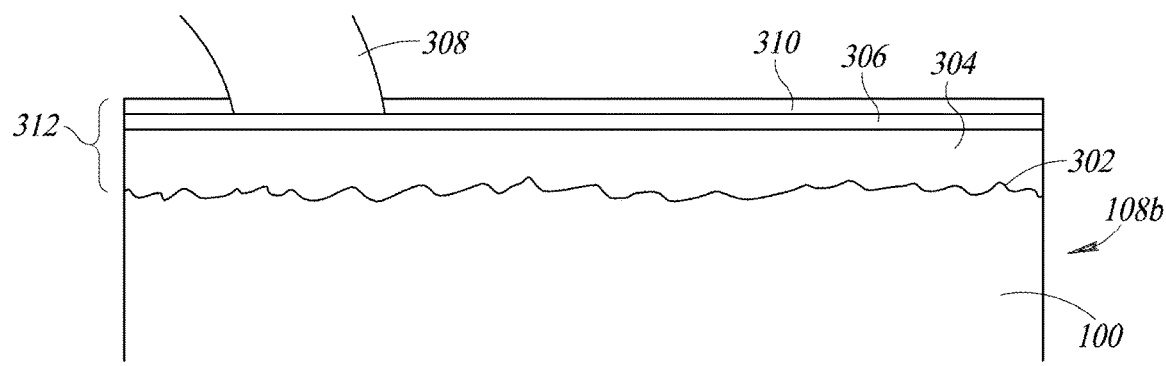

FIG. 3D depicts the second lead 108*b* coated with a third coating 310. The first, second, and third coatings together comprise a multilayer coating 312 on the base material 100 of the second lead 108*b*. The third coating 310 may coat only a first side of the lead frame 102*b*, a plurality of sides of the lead frame 102*b*, or all exposed sides of the lead frame 102*b*, including interior surfaces. Fully coating all sides of the lead frame 102*b* allows for the coating application to be completed without the use of a mask, decreasing cost, time, and complexity of the coating application. In other embodiments, all sides of the lead frame 102*b* are coated with the third coating, including interior surfaces, and then a portion of the third coating is removed to allow for the conductive connector 308 to be coupled to the second coating 306.

The third coating 310 may be applied or fixed to the second coating 306 using any known application technique, including CVD, PVD, spin coating, and electroplating. In some embodiments, the third coating 310 is formed by a reaction between the second coating 306 and a reactive species. In particular, in one embodiment the second coating 306 is silver and is reacted with a reactive species including oxygen using a wet process to form the third coating 310 of a silver oxide.

The third coating 310 is an adhesion promotion compound for an encapsulant. While the second coating 306 has superior bonding characteristics with the conductive connector 308, the second coating 306 may not be optimized for mechanical bonding to an encapsulant. In contrast, the third coating 310 provides improved adhesion to an encapsulant. For example the third coating 310 may be an oxide or a hydroxide that improves mechanical bonding with an encapsulant like a molding compound.

The improved mechanical bonding can be achieved through superior chemical properties of the third coating 310 as it relates to an encapsulant. For example, the application of the third coating 310 may help prevent sulfurization of the second coating 306. As sulfurization of the materials used in the second coating 306 (e.g., silver) can be detrimental to bonding strength of an encapsulant to the lead frame 102*b*, the application of the third coating 310 to prevent sulfurization of the second coating 306 can increase the strength of the mechanical bond to an encapsulant. Improved mechanical bonding can refer to an increased pull strength, an increased sheer stress resistance, or both.

Figure 4:
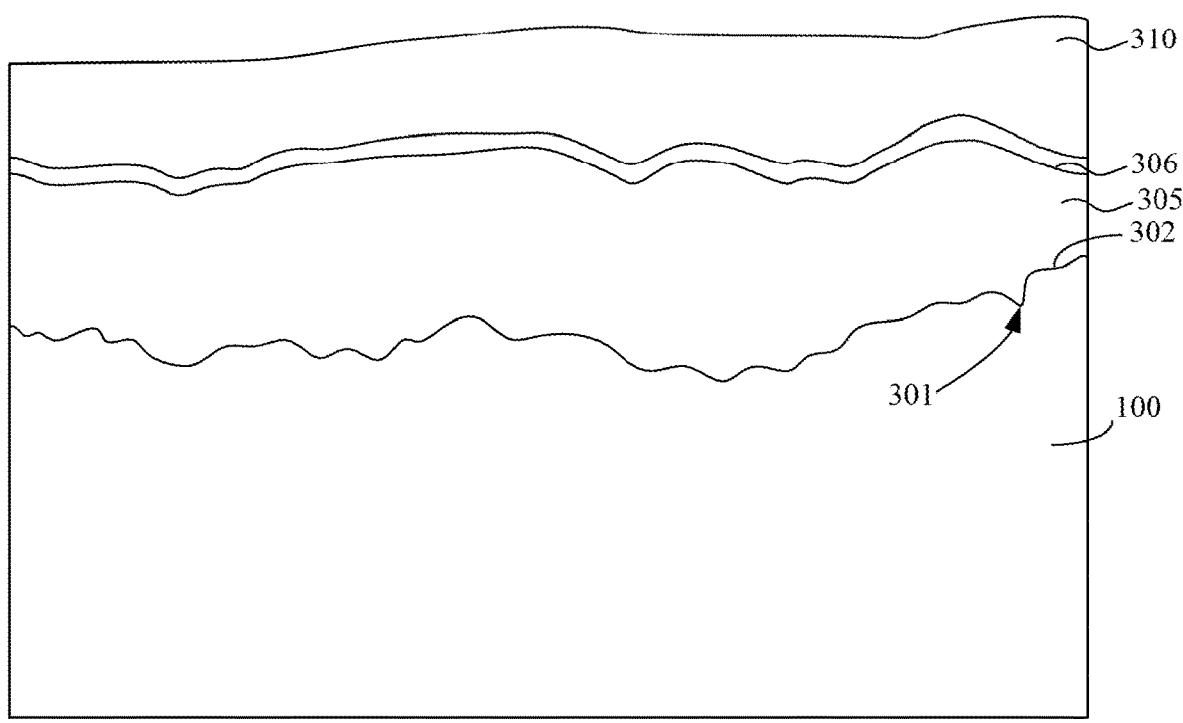
FIG. 4 is a cross-sectional view of another embodiment of a lead frame taken at a magnified view area.

FIG. 4 depicts a main body of a substrate 100 coated with a first coating 305 (e.g., of a copper material). The substrate 100 is a lead frame, such as one that is copper. In particular embodiments, the first coating 305 is pure copper. In some embodiments, the first coating 305 has a thickness greater than the depth of the scratches or surface irregularities of the surface 302, such as irregularity 301. As can be seen in FIG. 4, the first coating 305 has an irregular first side on the scratches or surface irregularities of the substrate 100, and an irregular second side opposite the first side. However, the irregularity (e.g., surface roughness) of the second side is less than the irregularity of the first side. In other words, the second side smooths the surface of the scratches or surface irregularities of the surface 302. In other embodiments, the thickness of the first coating 305 is independent of the depth of the scratches or surface irregularities in the surface 302.

A surface irregularity of the substrate 100 is greater than a surface irregularity of the second layer 306, providing a smoother surface for bonding. A surface irregularity of the third layer 310 is less than the surface irregularity of the substrate and of the second layer 306.

Figure 5:
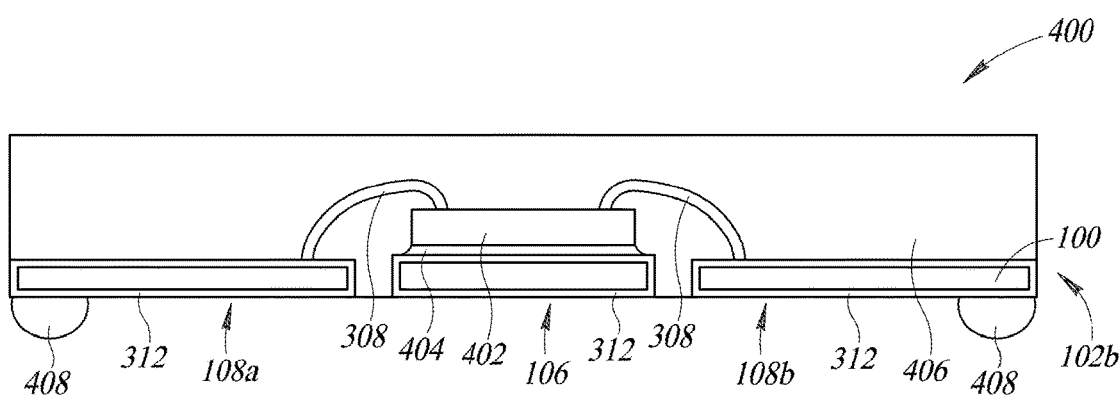
FIG. 5 is a cross-sectional view of an exemplary semiconductor package.

FIG. 5 is a cross-sectional view of an exemplary semiconductor package 400 including the lead frame 102b. The semiconductor package 400 includes the lead frame 102 having the die pad 106 and the first and second leads 108a, 108b. The die pad 106 and the first and second leads 108a, 108b are each coated with the multilayer coating 312. First and second conductive connectors 308 are coupled to first and second leads 108a, 108b, respectively, and to a semiconductor die 402. The semiconductor die 402 is any one of a number of integrated circuits with input/output ports coupled to the leads 108. In addition, the semiconductor die 402 is mechanically coupled to the die pad 106 of the lead frame 102b by an adhesive 404. In some embodiments, the adhesive 404 is directly coupled to the second coating 306. In other embodiments, the adhesive 404 is directly coupled to the die pad 106, the first coating 304, or the third coating 310. The semiconductor die 402 may be thermally or electrically coupled to the die pad 106 by the adhesive 404 and/or other materials.

Surrounding the semiconductor die 402 is an encapsulant 406, such as a molding compound or a resin. The encapsulant 406 may provide the structural support for the semiconductor package 400 as well as environmental protection. The encapsulant 406 is on or adheres to the third coating 310 of the lead frame 102b, in one embodiment. In other embodiments, the encapsulant 406 is on another layer of the multilayer coating 312, or the underlying base material. The components of the lead frame 102b may have a surface flush with a surface of the encapsulant 406. In other embodiments, one or more components of the lead frame 102b protrude from a surface of the encapsulant 406. The encapsulant 406 partially or completely encapsulates the semiconductor die 402.

In addition, depicted in FIG. 5 are bonding balls 408. The bonding balls 408 are solder balls in one embodiment, and in other embodiments may be any conductive connector for coupling the semiconductor package 400 to external circuits. The bonding balls 408 are coupled to ends of the leads 108. An input or output port of the semiconductor die 402 may thereby be coupled to a circuit external to the semiconductor package 400 through respective ones of the conductive connectors 308, the leads 108, and the bonding balls 408, in turn.

Figure 6:
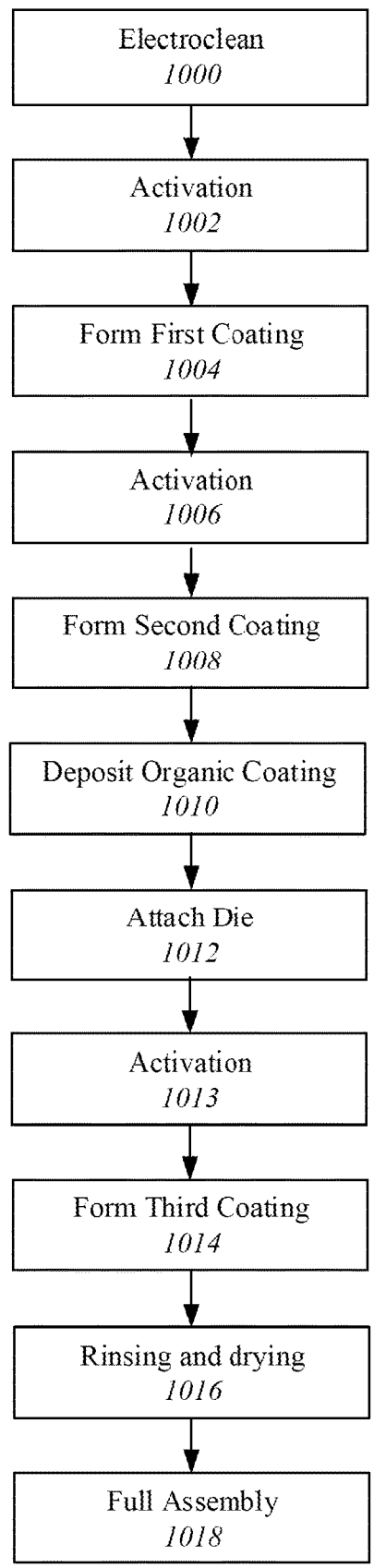
FIG. 6 is a flow chart of an illustrative method of the disclosure.

A flow chart of an illustrative method of the disclosure is shown in FIG. 6. After an initial electrocleaning step 1000, the lead frame may undergo an activation step 1002 followed by deposition of a first coating in step 1004. Then, in step 1006, the lead frame may undergo a second activation step. A second coating is then deposited onto the surface of the first coating in step 1008.

Next, in step 1010, an organic coating (e.g., an anti-EBO (epoxy bleed out) coating) is applied to the surface of the second coating. Such an organic coating may reduce or eliminate epoxy bleeding out during the die attachment. Then, in step 1012, the die is attached to the surface of the second coating. A third activation step 1013 is then performed, followed by forming the third coating in step 1014.

One or more rinsing steps, such as step 1016, may be employed at any suitable point in the methods disclosed.

Then, in step 1018, the encapsulant (e.g. the molding compound) is formed on the die, the wires, and the lead frame to form the package. After assembling the package, a deflashing step can be employed to remove resin flashes from the encapsulation process. Then, an electrocleaning step, rinse step, or both may be employed.

The resulting packaging structure includes, in some embodiments, a copper first coating on a bare copper lead frame, a silver layer on the copper first coating, and a silver oxide layer on the silver layer. The die is bonded via bonding wires to the silver layer, and the silver oxide layer abuts sides of the die and wires. An encapsulant surrounds at least a portion of the silver oxide layer. Thus, in some embodiments, no portion of the silver oxide layer is exposed. In other words, the encapsulant completely covers the silver oxide layer. In specific embodiments, the series of layers on the bare copper lead frame includes a copper first coating that ranges from about 1 µm to about 2 µm thick, a silver second coating that ranges from about 0.1 µm to about 0.3 µm thick, and a silver oxide third layer that ranges from about 1 nm to about 3 nm.

In an alternative method of the disclosure, the die is attached to the surface of the second coating after the third coating has been formed. In such methods, a portion of the third coating (e.g., corresponding to the location at which the die is attached) is removed before attaching the die and assembling the final package structure (e.g., wire bonding, forming the encapsulant, etc.). In embodiments where the wires are bound to the surface of the second coating, portions of the third coating are removed that correspond to the locations at which the wires are bound.

Briefly, the alternative method optionally includes an initial electrocleaning step and an activation step. Then, a first coating is deposited (e.g., by electrodeposition, CVD, etc.). The lead frame may then undergo a second activation step, and then the second coating is deposited (e.g., by electrodeposition, CVD, etc.) onto the surface of the first coating. An optional third activation step may then be performed. The third coating is then formed on the second coating (e.g., by reacting the second coating with a reactive species, such as oxygen, by CVD, etc.). A portion of the third coating is then removed, exposing area(s) of the second coating.

Next, an organic coating (e.g., an anti-EBO coating) is applied to the exposed surface of the second coating and the die is attached to the surface of the second coating. After the die is attached, the final assembly steps, including wire bonding and forming the encapsulant (e.g. the molding compound) on the die, the wires, and the lead frame, proceed to form the package. After assembling the package, a deflashing step can be employed to remove resin flashes from the encapsulation process. One or more electrocleaning step, rinse step, or both, may be employed at any suitable point in the methods disclosed.

The above features describe some embodiments in which the use of precious metals are decreased while bonding strength of connective conductors to the lead frame and encapsulant to the lead frame is increased. Other benefits will also be apparent by those of skill in the art.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A method, comprising:
   forming a lead frame, including:
      forming a main body and a plurality of leads of a substrate;
      electroplating a first coating of copper or a copper alloy on the main body of the substrate;
      forming a second coating of a precious metal on the first coating; and
      forming a third coating of an adhesion promotion compound on the second coating by reacting a surface of the second coating with a reactive species.

2. The method of claim 1, wherein the forming the main body and the plurality of leads includes rolling a sheet of copper or a copper alloy, the rolling the sheet including scratching a surface of the substrate.

3. The method of claim 1, wherein the first coating is pure copper, the second coating is silver and the third coating is silver oxide.

4. The method of claim 1, wherein the substrate has a first hardness ranging from 100 HV to 200 HV and the first coating has a second hardness ranging from 100 HV to 120 HV, the second hardness being less than the first hardness.

5. The method of claim 1, wherein a thickness of the first coating ranges from 0.2 µm to 2.0 µm and a thickness of the second coating ranges from 0.01 µm to 0.1 µm.

6. The method of claim 1, further comprising bonding a metal wire to the second coating.

7. A method, comprising:
   forming a first coating of copper on a lead frame;
   forming a second coating of a transition metal on the first coating; and
   forming a third coating of an adhesion promotion compound on the second coating by reacting a surface of the second coating with a reactive species.

8. The method of claim 7, comprising forming the first coating of copper with an electroplating process.

9. The method of claim 7, further comprising placing an integrated circuit die on a die pad of the lead frame after forming the second coating.

10. The method of claim 9, further comprising forming the third coating on the lead frame after placing the die on the die pad.

11. The method of claim 10, wherein the third coating is an oxide of the second coating.

12. The method of claim 10, wherein the second coating includes one or more of gold, silver, an nickel.

13. The method of claim 9, further comprising forming an electrical connecter between the die and a lead of the lead frame.

14. The method of claim 13, further comprising forming the third coating after forming the electrical connector.

15. The method of claim 14, wherein the electrical connector is a bonding wire.

16. The method of claim 9, covering the die in a molding compound.

17. The method of claim 9, wherein placing the die on the die pad includes placing the die on the second coating on the die pad.

18. A method, comprising:
   electroplating a first coating of copper on a die pad and a lead of a lead frame;
   forming a second coating of gold or silver on the first coating on the die pad and on the lead frame;
   placing a die on the second coating on the die pad; and
   forming a third coating of an adhesion promotion compound on the second coating on the lead after placing the die on the die pad.

19. The method of claim 18, wherein the third coating is an oxide of the second coating.

20. The method of claim 18, further comprising forming the third coating on portions of the die pad outside the die.

* * * * *